United States Patent

Chan et al.

(10) Patent No.: US 6,194,276 B1
(45) Date of Patent: Feb. 27, 2001

(54) RADIATION HARDENED SEMICONDUCTOR MEMORY

(75) Inventors: Tsiu C. Chan; Mehdi Zamanian, both of Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/590,566

(22) Filed: Jun. 8, 2000

Related U.S. Application Data

(62) Division of application No. 09/393,125, filed on Sep. 10, 1999, now Pat. No. 6,091,630.

(51) Int. Cl.$^7$ .......................... H01L 21/336; G11C 11/00
(52) U.S. Cl. ..................... 438/294; 365/156; 365/53; 257/499; 257/508
(58) Field of Search .................... 438/294; 365/156, 365/154, 53; 257/408, 488, 499, 508, 509, 368

(56) References Cited

U.S. PATENT DOCUMENTS

| | | | |
|---|---|---|---|
| 4,095,251 | * | 6/1978 | Dennard et al. ............... 357/23 |
| 4,141,027 | * | 2/1979 | Baldwin et al. ............... 357/51 |
| 4,262,298 | * | 4/1981 | Tuan et al. ................... 357/41 |
| 4,513,304 | * | 4/1985 | Takemae ...................... 357/23.6 |
| 4,561,170 | * | 12/1985 | Doering et al. ............... 29/571 |
| 4,570,331 | * | 2/1986 | Eaton, Jr. et al. ............ 29/576 B |
| 4,853,894 | * | 8/1989 | Yamanaka et al. ............. 365/154 |
| 4,900,693 | * | 2/1990 | Manning ....................... 437/78 |
| 4,960,725 | * | 10/1990 | Noguchi ....................... 437/570 |
| 4,994,893 | * | 2/1991 | Ozaki et al. .................. 357/68 |
| 4,996,575 | * | 2/1991 | Ipri et al. .................... 357/23.7 |
| 4,998,161 | * | 3/1991 | Kimura et al. ................. 357/23.4 |
| 5,043,790 | * | 8/1991 | Butler ......................... 357/68 |
| 5,067,000 | * | 11/1991 | Eimori et al. ................. 357/53 |
| 5,104,822 | * | 4/1992 | Butler ......................... 437/52 |
| 5,151,759 | * | 9/1992 | Vinal .......................... 357/23.3 |
| 5,162,890 | * | 11/1992 | Butler ......................... 257/306 |
| 5,164,803 | * | 11/1992 | Ozaki et al. .................. 257/372 |
| 5,164,806 | * | 11/1992 | Nagatomo et al. .............. 257/395 |
| 5,221,419 | * | 6/1993 | Beckett ........................ 156/630 |
| 5,225,704 | * | 7/1993 | Wakamiya et al. .............. 257/409 |
| 5,320,975 | * | 6/1994 | Cederbaum et al. ............. 437/44 |
| 5,550,397 | * | 8/1996 | Lifshitz et al. ............... 257/412 |
| 5,633,524 | * | 5/1997 | Ueda et al. ................... 257/369 |

FOREIGN PATENT DOCUMENTS

| | | |
|---|---|---|
| 41 16 690 A1 | 11/1991 | (DE) . |
| 0 150 993 A3 | 8/1985 | (EP) . |
| 0 321 738 A3 | 6/1989 | (EP) . |
| 0 361 121 A3 | 4/1990 | (EP) . |

OTHER PUBLICATIONS

Terman, "Aluminum–Silicon Self–Aligned Gate Process With Field Shield," *IBM Technical Disclosure Bulletin*, 15(9), 1973, pp. 2852–2854.

Krick, "Triple–Density MNOS Memory Array With Field Shield," *IBM Technical Disclosure Bulletin* 16(6), 1973, pp. 1723–1725.

(List continued on next page.)

*Primary Examiner*—Charles Bowers
*Assistant Examiner*—David S Blum
(74) *Attorney, Agent, or Firm*—Theodore E. Galanthay; Lisa K. Jorgenson; David V. Carlson

(57) ABSTRACT

A radiation hardened memory device having static random access memory cells includes active gate isolation structures placed in series with oxide isolation regions between the active regions of a memory cell array. The active gate isolation structure includes a gate oxide and polycrystalline silicon gate layer electrically coupled to a supply terminal resulting in an active gate isolation structure that prevents a conductive channel extending from adjacent active regions from forming. The gate oxide of the active gate isolation structures is relatively thin compared to the conventional oxide isolation regions and thus, will be less susceptible to any adverse influence from trapped charges caused by radiation exposure.

6 Claims, 3 Drawing Sheets

OTHER PUBLICATIONS

Abbas et al., "Low–Leakage, N–Channel Silicon Gate FET With A Self–Aligned Field Shield," *IEDM Technical Digest,* IBM System Products Div., N.Y. 1973, pp. 371–373.

Terman et al., "Making A One–Device Memory Cell," *IBM Technical Disclosure Bulletin 15*(9), 1973, pp. 2852–2854.

Kalter and Vanderslice, Jr., "Making A One–Device Memory Cell," *IBM Technical Disclosure Bulletin 18*(4), Sep. 1975, pp. 1019–1020.

Dingwell et al., "A High Speed Bulk CMOS $C^2L$ Microprocessor," Microprocessor Advancements, in *Proceedings of the IEEE International Solid State Circuits Conf.,* 1977, pp. 136–137.

Koyanagi et al., "Novel High Density, Stacked Capacitor MOS RAM," *IEEE/IEDM,* Washington, D.C., Dec. 4–6, 1978, pp. 348–351.

Wakamiya et al., "Fully Planarized 0.5μm Technologies for 16M DRAM," *IEEE/IEDM,* Sa Francisco, Dec. 11–14, 1988, pp. 246–249.

Shimizu et al., "Deep Submicron Device Isolation With Buried Insulator Between Source/Drain Polysilicon (BIPS)," *IEEE/IEDM,* San Francisco, Dec. 11–14, 1988, pp. 96–99.

"Selective Removal of Polysilicon to Obtain Improved Masterslice,"0 *IBM Technical Disclosure Bulletin 31*(4), 1988, pp. 249–252.

Erb et al., "Hi–C Isolation of DRAM Storage Capacitors," *IEEE/IEDM,* San Francisco, Dec. 13–15, 1992, pp. 612–615.

Manchanda et al., "A High–Performance Directly Insertable Self–Aligned Ultra–Rad–Hard an Enhanced Isolation Field–Oxide Technology for Gigahertz Silicon," *IEEE Transactions on Electron Devices 36*(4):651–658, 1989.

Iwamatsu et al. "CAD–Compatible High–Speed CMOS/SIMOX Technology Using Field–Shield Isolation For 1M Gate Array," *IEEE/IEDM,* Washington, D.C., Dec. 5–8, 1993, pp. 475–478.

\* cited by examiner

RADIATION HARDENED SEMICONDUCTOR MEMORY

CROSS-REFERENCE TO RELATED APPLICATION

This application is a Divisional of U.S. patent application Ser. No. 09/393,125, filed Sep. 10, 1999 now U.S. Pat. No. 6,091,630.

TECHNICAL FIELD

The present invention relates generally to semiconductor memory devices, and more particularly, to a radiation hardened semiconductor static random access memory cell.

BACKGROUND OF THE INVENTION

Semiconductor memory devices used in outer space, for example, in a satellite, are subjected to severe environmental conditions that may compromise the integrity of the stored data, or cause the memory devices to fail. In many cases, the memory devices are part of a larger embedded system, where the memory device is just one of many devices sharing the same die. The integrity of the memory devices used in outer space applications is critical because the information stored by the memory devices may be related to critical functions, such as guidance, positioning, and transmitting and receiving data from a ground base station. Furthermore, semiconductor memory devices for use in space applications should remain functional for the lifetime of the satellite, which may be as long as several years. Contrast this with applications where the memory devices are also subjected to harsh operating conditions, such as guidance systems in missiles, but only for a relatively short time period.

One cause of errors in semiconductor memory devices that are used in outer space applications is due to high-energy particles impinging on the memory device. There are several forms of high energy particles in outer space. For example, there are alpha particles and gamma rays, to name a couple. These high-energy particles strike the semiconductor material on which the memory devices are formed with enough energy to cause the generation of electron-hole pairs. The resulting charge carriers are often trapped in the various oxide layers of the memory devices. In the case of metal oxide semiconductor ("MOS") transistors, charges trapped in the gate oxide will shift the threshold voltage, Vt, of the transistor. As a result, leakage currents of the transistors, and consequently, of the memory devices may increase. Where the transistor is used as a transfer gate for a conventional memory cell, the increased leakage current may compromise the integrity of the data stored by the data storage node, such as a capacitor, by allowing the charge representing the data to dissipate.

The frequency or number of charges trapped in an oxide layer is proportional to the thickness of the oxide layer. Consequently, oxides having a greater thickness will, on the average, have a greater number of trapped charges. In the case where the oxide is relatively thick, for example, approximately 4000–5000 Å, charge trapped in the oxide will result in a much more dramatic shift in the leakage current characteristics than for an active transistor having a relatively thin gate oxide. Such an application of thick oxide is for isolating active transistor areas in which memory cells may be formed, for example, regions of local oxidation of silicon ("LOCOS"). The accumulating charge trapped in the LOCOS region may become great enough to cause a conduction channel to form below the LOCOS region, and consequently allow current to leak between neighboring active transistor regions.

As mentioned previously, transistors in the active region of a memory device, which typically have gate oxides that are much thinner than the oxides of the LOCOS region, will have shifting Vts as a result of the trapped charges in the gate oxide. A method that has been used to accommodate the shifting Vts is to raise the Vts of the active transistors so that the relative changes in the Vts due to the trapped charges are minor. Thus, the effect that trapped charges will have on the overall performance of the memory devices is minimized. However, the aforementioned technique is not as effective when applied to LOCOS isolation regions. Although the Vt of the incidental transistor of the LOCOS isolation regions may be adjusted so that the Vt shift due to charge trapped in the thick oxide is relatively small, the resulting isolation region will have an unacceptably low breakdown voltage.

Another technique used to accommodate charge trapped in a thick LOCOS isolation region is to create a two-layer oxide isolation structure. A relatively thin layer of oxide of approximately 500 Å is grown in the isolation region, followed by the formation of a relatively thick layer of phosphorous doped oxide of approximately 4000 Å over the relatively thin layer of oxide. The phosphorous doped oxide is subsequently densified by baking. The resulting structure minimizes the effect trapped positive charges have on the leakage characteristics of the isolation region by neutralizing the trapped positive charges with the abundance of electrons of the relatively thick phosphorous doped oxide. However, this approach is limited by the doping concentration of the relatively thick oxide layer. That is, the greater the level of impurities, the greater the diffusion of the impurities from the thick oxide into the adjacent layers.

Another approach taken in providing semiconductor memory devices suitable for use in space applications is through a method of trial and error. Samples of potentially applicable semiconductor memory devices are taken from several different process lots and subjected to severe radiation conditions that simulate the environment of outer space. The sample devices are subsequently tested for functionality and reliability. Those memory devices from the process lots having samples surviving the testing are judged to be acceptable for use in applications in outer space. However, this approach merely screens existing memory devices for those which may be sufficient for use in outer space applications, and consequently, the quantity of satisfactory memory devices produced by this method is subject to the unpredictable nature of semiconductor processing.

Therefore, there is a need for a semiconductor memory device having reliable data retention over a sufficiently long period of time for use in applications subjected to severe radiation environments, such as outer space.

SUMMARY OF THE INVENTION

According to the present invention, a semiconductor memory includes static random access memory ("SRAM") cells formed on a substrate and arranged in a matrix where each memory cell has data storage nodes that are selectively coupled through transfer gates to a respective sense node. The data storage nodes are electrically isolated from each other, and the data storage nodes of adjacent memory cells by an active gate isolation structure that is formed in between the nodes and coupled to a voltage potential. The active gate isolation structure prevents a conductive channel extending between the data storage nodes of the memory cells from forming. The data storage nodes of the memory cells may be further isolated from one another by an oxide isolation structure formed in series with the active gate isolation structure and in between the data storage nodes.

DETAILED DESCRIPTION OF THE INVENTION

Embodiments according to the present invention use both a thick field isolation structure and an active gate isolation structure, either alone or in combination, to reduce leakage currents in a semiconductor memory cell array. The technique is described herein with respect to radiation hardened static random access memory ("SRAM") cells. Data storage nodes of a memory device are isolated from one another using an active gate isolation structure formed adjacent to a thick field oxide isolation structure. The resulting isolation between the data storage nodes is formed from the active gate isolation structure being in series with the adjacent thick field oxide isolation structures. The active gate is tied to a voltage potential in order to prevent a conductive channel from forming under the active gate isolation structure. Embodiments of the memory cell structure described herein may be used in a variety of memory applications, such as embedded memories, as well as discrete memory devices, and the like.

The thickness of the oxide of the active gate isolation structure is relatively thin compared to the thickness of the thick field oxide isolation structures and will trap less charge when the semiconductor memory device is exposed to a radiation environment. Consequently, the probability of accumulating trapped charge in the gate oxide of the active gate isolation structure sufficient to create an inversion layer is reduced. Although charge trapped in the thick field oxide may nevertheless cause an inversion layer to form under the thick field oxide, the inversion layer will not extend under the active gate isolation structure.

The fabrication and use of active gate isolation structures in semiconductor integrated circuits has been previously described in U.S. Pat. No. 5,821,600 to Chan, issued Oct. 13, 1998, and U.S. Pat. No. 5,849,614 to Chan, issued Dec. 15, 1998, which are incorporated herein by reference. These patents describe using a first polysilicon layer for the active gate isolation, and a second polysilicon layer for the gate structures of the transistors. These patents further discuss the advantages of isolating active transistor regions using an active gate structure over using conventional thick field oxide isolation.

Figure 1:
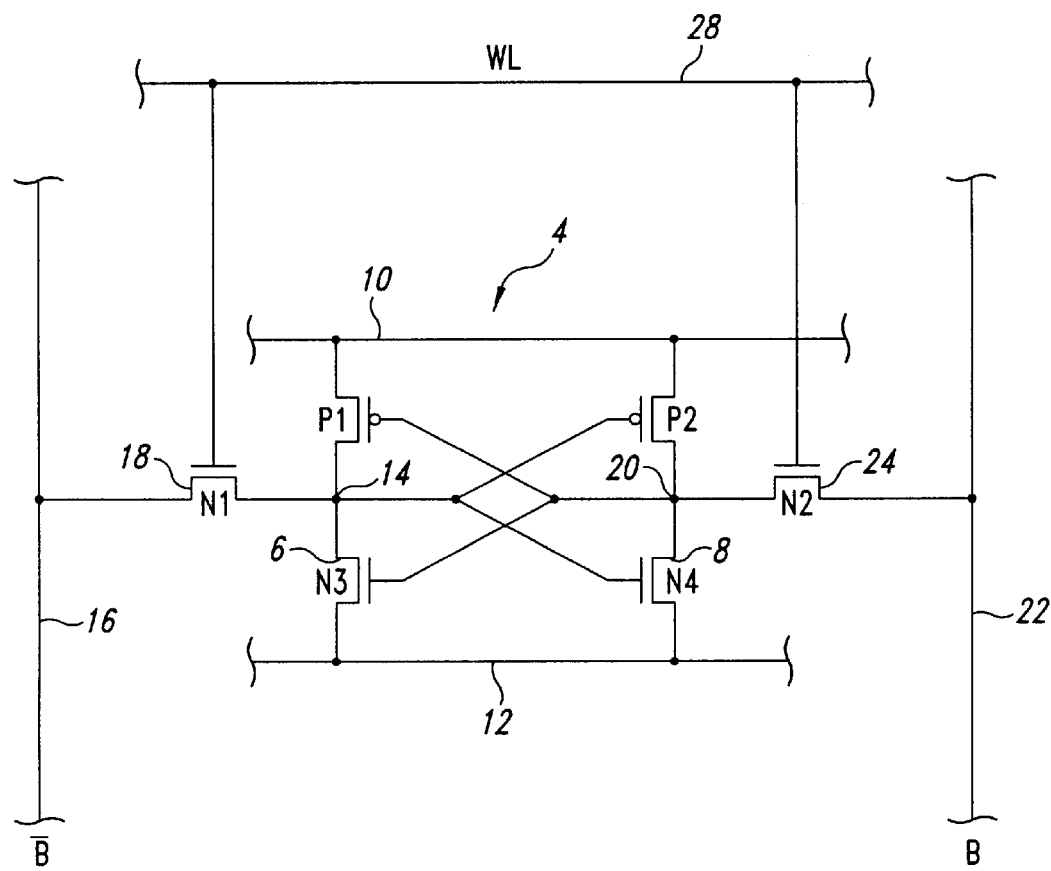
FIG. 1 illustrates a schematic diagram of a conventional SRAM memory cell.

A conventional SRAM memory cell 4 is illustrated in FIG. 1. The SRAM cell 4 is formed from two cross-coupled CMOS inverters 6 and 8, coupled between a first supply terminal 10 and a second supply terminal 12. The supply terminal 10 is typically the power supply voltage, VCC, and the supply terminal 12 is typically ground. A storage node 14 of the inverter 6 is coupled to a complementary bit line 16 through an NMOS transfer gate 18. A storage node 20 of the inverter 8 is similarly coupled to a non-complementary bit line 22 through an NMOS transfer gate 24. The bit lines 16 and 22 may also be viewed as respective sense nodes. The storage nodes 14 and 20, or data storage nodes, store the complementary and non-complementary data written to the SRAM cell 4 until new data is written, or power is removed. The gates of the NMOS transfer gates 18 and 24 are coupled to a word line 28 so that when sufficient voltage is applied to the word line 28, data stored by the SRAM cell 4 is provided to the complementary and non-complementary bit lines 16 and 22, or new data may be written to the SRAM cell 4.

Figure 2:
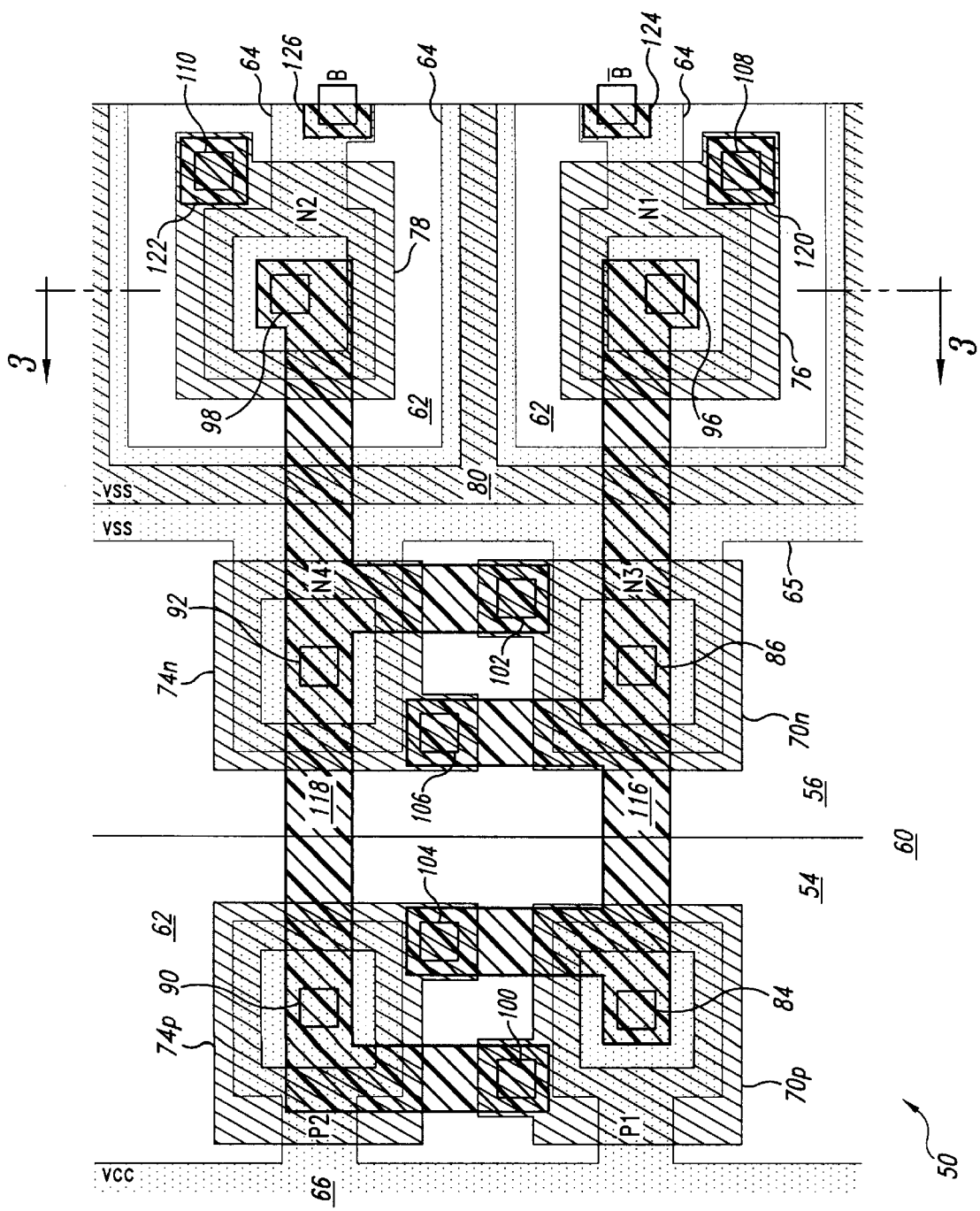
FIG. 2 illustrates a plan view of an SRAM memory cell according to an embodiment of the present invention.

Illustrated in FIG. 2 is a planar layout of an SRAM memory cell 50 in accordance with an embodiment of the present invention. As is conventional in the field of integrated circuit representation, the lateral sizes and thicknesses of the various layers are not drawn to scale and these various layers or layer portions are arbitrarily enlarged to improve drawing legibility.

An n-well region 54 and a p-well region 56 are provided on a substrate 60. It can be appreciated that the n-well region 54 and the p-well region 56 may be also formed in a larger well or another layer, such as an epitaxial layer. However, in the interests of brevity, the description of the embodiments according to the present invention will refer to only the substrate 60. Thick oxide isolation regions 62 are formed on the substrate 60. The process of forming the thick oxide regions 62 is well known in the art and need not be described in detail herein. For example, the thick field oxide regions 62 may take the form of a trench oxide isolation structure, a LOCOS field oxide, a trench field oxide, or the like. Active n+ regions 64 and 65 are implanted in the p-well region 56, and an active p+ region 66 is implanted in the n-well region 54 in the areas where the thick oxide isolation regions 62 have not been formed. The active n+ region 65 is coupled to a ground VSS representing the supply terminal 12, and the active p+ region 66 is coupled to VCC representing the supply terminal 10.

A gate oxide layer and polysilicon layer are deposited over the surface and etched to form polysilicon gates for the inverters 6 and 8, and the transfer gates 18 and 24 (FIG. 1). Polysilicon gates 70p and 70n, and 74p and 74n correspond to the gates of PMOS and NMOS transistors of the inverters 6 and 8, respectively. Polysilicon gates 76 and 78 correspond to the gates of the transfer gates 18 and 24. respectively. A polysilicon gate 80 is provided for the purposes of an active gate isolation structure. The gate 80 is coupled to the ground supply terminal VSS to ensure that a conduction layer does not form between the active regions of the transfer gates 18 (poly gate 76), the transfer gate 24 (poly gate 78), and the drains of the NMOS transistors of the inverters 6 and 8 (poly gates 70n and 74n, respectively). The gates of the transistors and the active gate isolation structure are formed contemporaneously, and as a result, the gate oxide of the active gate isolation structures will have a thickness similar to the gate oxide of the PMOS and NMOS transistors. For example, the gate oxide thickness may be between 20 to 300 angstroms thick. Consequently, less charge may be trapped in the thin gate oxide compared to the thick oxide isolation regions 62 resulting in the active gate isolation structures being less susceptible to adverse influences caused by trapped charges.

As shown in FIG. 2, contacts 84–98 and vias 100–110 are formed through a dielectric layer deposited subsequent to the polysilicon gate formation. A first metal layer is then deposited over the dielectric layer and etched to form interconnects 116 and 118. The interconnect 116 couples together the drains of the PMOS and NMOS transistors of the inverter 6 (through contacts 84 and 86), and the gates of the PMOS and NMOS transistors (through vias 104 and 106) of the inverter 8, to the active region of the transfer gate 18 (through via 96). With respect to FIG. 1, the active region of the transfer gate 18 represents the data storage node 14, which is coupled to the drain regions of the PMOS and NMOS transistors of the inverter 6 by the interconnect 116. Similarly, the interconnect 118 couples together the drains of the PMOS and NMOS transistors of the inverter 8 (through contacts 90 and 92), and the gates of the PMOS and NMOS transistors (through vias 100 and 102) of the inverter 6, to the active region of the transfer gate 24 (through via 98). The active region of the transfer gate 24 represents the data storage node 20, which is coupled to the drain regions of the PMOS and NMOS transistors of the inverter 8 by the interconnect 118. First metal regions 120 and 122 are provided for a subsequent metal layer that will form the word line 28. Similarly, first metal regions 124 and 126, which represent the sense nodes, are provided for a subsequent metal layer that will form the bit lines 16 and 22, respectively.

Figure 3:
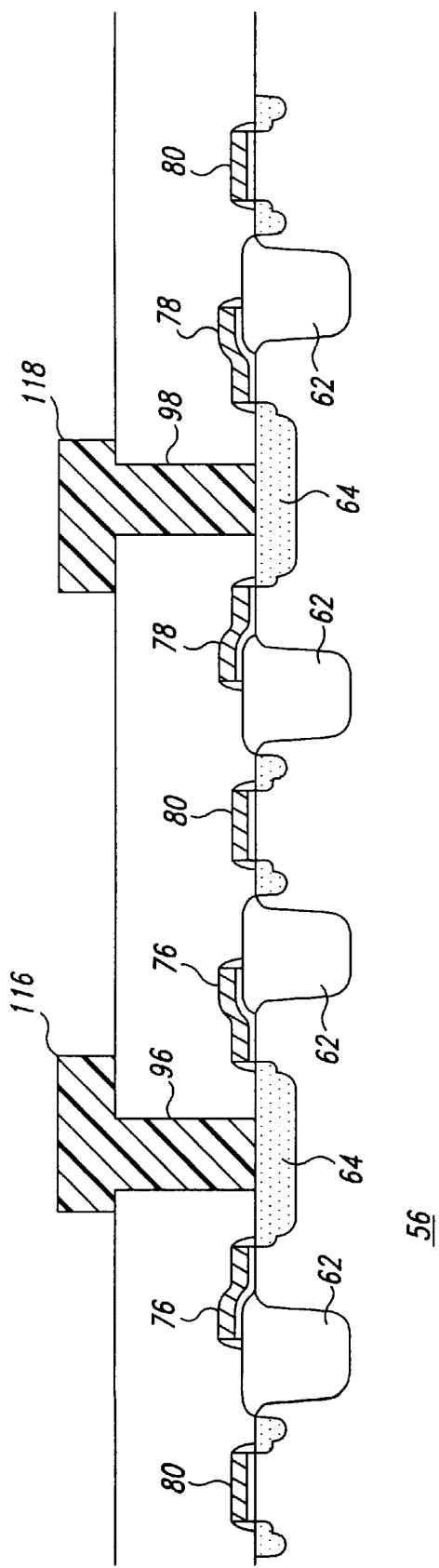
FIG. 3 illustrates a cross-sectional view of the SRAM memory cell shown in FIG. 2.

A cross-sectional view of the SRAM cell 10 of FIG. 2 is provided in FIG. 3. The view is taken through the contacts 96 and 98, that is the storage nodes 14 and 20, respectively. Separating the active n+ regions 64 in which the data storage nodes 14 and 20 are formed are thick field oxide isolation regions 62 and an active gate isolation structure represented by the polysilicon gate 80. As mentioned previously, the polysilicon gate 80 is connected to a voltage potential to ensure that a conduction channel will not form in the region under the polysilicon gate 80. Thus, even if enough trapped charge accumulates in the thick field oxide isolation regions 62 to create a conduction channel under each respective thick field oxide, leakage currents cannot flow between the contacts 96 and 98 because the region under the polysilicon gate 80 remains nonconductive.

It will be appreciated that various methods for connecting the polysilicon gate 80 to the appropriate voltage potential are well known in the art. Thus, the specific form of the connection should not limit the scope of the present invention. For example, in the present example, the active n+ regions 64 in which the data storage nodes 14 and 20 are formed is implanted in the p-well 56. Consequently, the polysilicon gate 80 of the active isolation structure should be coupled to ground. Where the active n+ region 65 is also connected to ground, the polysilicon gate 80 may be properly biased by being directly connected to the active n+ region 65 by metallization layers and/or buried contacts. For example, a conductive strap may be used to connect the polysilicon gate 80 to the active n+ region 65 at regular intervals, perhaps every 16 or 32 memory cells.

Further isolating the contacts 96 and 98 are polysilicon gates 76 and 78, which surround the respective contact. As mentioned previously, polysilicon gates 76 and 78 represent the gates of the transfer gates 18 and 24, respectively. While the word line 28 remains deactivated, the area under the polysilicon gates 76 and 78 are nonconductive, and consequently, provides greater isolation of the contacts 96 and 98. The polysilicon gates 70*p*, 70*n*, 74*p*, and 74*n*, which have a similar shape as polysilicon gates 76 and 78, also provide additional isolation for the contacts 84–92, respectively.

As will be appreciated, the main steps according to the present invention are shown and described herein, however, some steps in the process have not been shown because such standard processing steps are commonly used. Additional processing steps such as threshold adjustment implants, epitaxial growth, well formation, and the like, may be carried out as desired. For example, the polysilicon gates are illustrated in FIG. 3 as having oxide sidewall formations and the active n+ regions 64 as having a profile where additional implant steps were made following the formation of the polysilicon gate layer. However, these additional process steps for the formation of these structures are well known in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for making a semiconductor static random access memory cell array for a semiconductor memory, the method comprising:

forming a static memory cell having first and second storage nodes formed on first and second active regions formed in a substrate, and further having first and second transfer transistors coupled between the first and second storage nodes and first and second sense nodes, all respectively, each transfer transistor having a transfer gate formed from a polysilicon layer to selectively couple the storage node to a respective sense node;

forming oxide isolation regions in the substrate adjacent to the first and second active regions; and forming active gate isolation structures on the substrate disposed in between the first and second data storage nodes, the active gate isolation structures biased to a first voltage to prevent a conduction channel from forming under the active gate isolation structures, wherein the active gate isolation structures are formed from the same polysilicon layer as the transfer gates of the first and second transfer transistor.

2. The method of claim 1, further comprising forming oxide isolation regions in the substrate in between the first and second active regions and adjacent to the active gate isolation structures.

3. The method of claim 2 wherein forming the oxide isolation regions comprises forming shallow trench isolation regions.

4. The method of claim 2, further comprising forming transfer gates of the first and second transfer transistor having a shape surrounding the respective data storage node.

5. The method of claim 2 wherein forming active gate isolations structures includes forming a buried contact coupling the active gate isolation structures to an third active region biased at the first voltage.

6. The method of claim 2 wherein the first voltage is ground.

* * * * *